United States Patent
LaGrandier et al.

(10) Patent No.: US 7,944,323 B2
(45) Date of Patent: May 17, 2011

(54) TEMPERATURE-COMPENSATED PIN-DIODE ATTENUATOR

(75) Inventors: Luis N. LaGrandier, Londonderry, NH (US); Joseph V. Kulbok, III, Londonderry, NH (US)

(73) Assignee: Skyworks Solutions, Inc., Woburn, MA (US)

( * ) Notice: Subject to any disclaimer, the term of this patent is extended or adjusted under 35 U.S.C. 154(b) by 147 days.

(21) Appl. No.: 12/349,037

(22) Filed: Jan. 6, 2009

(65) Prior Publication Data

US 2010/0171576 A1   Jul. 8, 2010

(51) Int. Cl.
*H01P 1/22* (2006.01)

(52) U.S. Cl. ...................................................... 333/81 R

(58) Field of Classification Search ................ 333/81 R, 333/81 A; 327/308, 309
See application file for complete search history.

(56) References Cited

U.S. PATENT DOCUMENTS

| | | | |
|---|---|---|---|
| 4,485,349 A | 11/1984 | Siegel et al. ..................... 330/3 |
| 4,987,606 A | 1/1991 | Ozeki et al. | |
| 5,179,353 A | 1/1993 | Miyake | |
| 5,999,047 A | 12/1999 | Zhang et al. .................. 330/149 |
| 6,108,527 A | 8/2000 | Urban et al. | |
| 6,577,177 B2 * | 6/2003 | Zhou et al. ..................... 327/317 |
| 6,934,310 B2 | 8/2005 | Brophy et al. ............. 372/38.02 |
| 7,256,664 B1 * | 8/2007 | Blacka et al. ............... 333/81 R |

FOREIGN PATENT DOCUMENTS

| | | |
|---|---|---|
| DE | 196 23 930 | 12/1997 |
| GB | 2 294 168 | 4/1996 |
| GB | 2 389 253 | 12/2003 |
| WO | WO 99/25064 | 5/1999 |
| WO | WO 02/084935 | 10/2002 |

* cited by examiner

*Primary Examiner* — Stephen E Jones
(74) *Attorney, Agent, or Firm* — Weide & Miller, Ltd.

(57) ABSTRACT

Temperature compensation is provided for a PIN-diode attenuator by temperature-sensitive resistive networks. In one embodiment, each temperature-sensitive resistive network includes a resistor connected in series to a parallel network formed from another resistor and an n-type thermistor, whose resistance decreases as temperature increases. As a result, as temperature increases, the currents applied by the resistive networks to PIN diodes in the attenuator also increases to compensate (at least partially) for the temperature dependence of the operations of the PIN-diode attenuator. Low-pass filters are provided in the resistive networks to inhibit relatively high-frequency (e.g., RF) signals in the attenuator from reaching and distorting the operations of the thermistors.

17 Claims, 3 Drawing Sheets

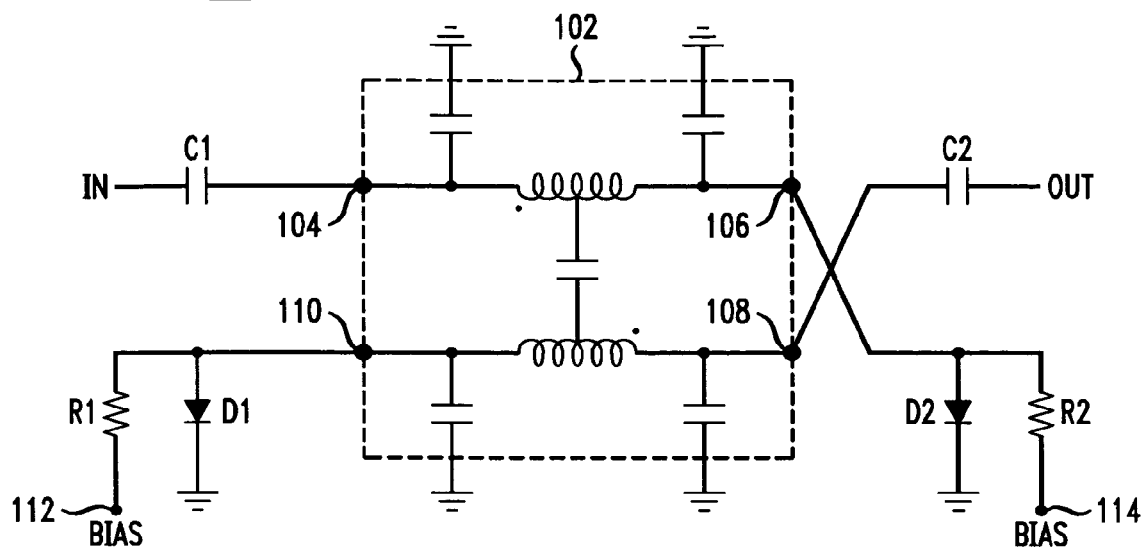
FIG. 1 *Prior Art*
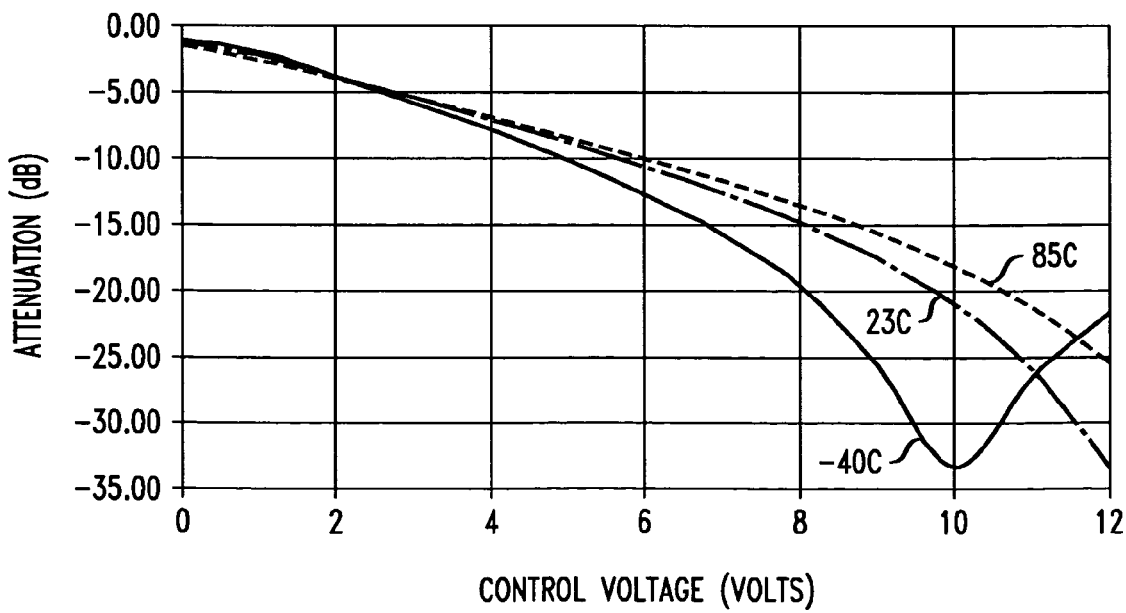
FIG. 2 *Prior Art*

300

TEMPERATURE-COMPENSATED PIN-DIODE ATTENUATOR

BACKGROUND OF THE INVENTION

1. Field of the Invention

The present invention relates to electronics, and, in particular, to PIN-diode attenuators.

2. Description of the Related Art

FIG. 1 shows a schematic diagram of a conventional PIN-diode attenuator 100 used, for example, to adjust signal levels, control impedance mismatch, and/or isolate circuit stages in electronics. PIN-diode attenuator 100 is a voltage-controlled attenuator that receives an input signal at input node IN and presents an attenuated output signal at output node OUT, where the level of attenuation is a function of the (positive) bias voltage BIAS applied at the two bias nodes 112 and 114.

Attenuator 100 comprises 90-degree hybrid 102, DC-blocking capacitors C1 and C2, bias resistors R1 and R2, and PIN diodes D1 and D2. Hybrid 102 splits power applied at its input port 104 evenly between its direct port 106 and its coupled port 110, with a 90-degree phase offset between the two output signals. Hybrid 102 also includes isolated port 108. Bias resistors R1 and R2 convert the bias voltage BIAS applied at bias nodes 112 and 114 from a bias-voltage source (not shown) into currents for driving the current-controlled PIN diodes D1 and D2.

By matching and applying equal currents through PIN diodes D1 and D2, the reflection coefficients at coupled port 110 and direct port 106 will be equal, thereby providing a good (i.e., low) voltage standing wave ratio (VSWR) (i.e., the ratio of the reflected power to the forward power), which implies better impedance matching at the input and output ports IN and OUT. The presence of 90-degree hybrid 102 makes attenuator 100 a non-reflective attenuator that maintains a relatively stable return loss over different attenuation levels as opposed to reflective attenuators that provide a good VSWR at only one level of attenuation.

FIG. 2 shows a graphical representation of the relationship of the level of attenuation (in dB) provided by PIN-diode attenuator 100 of FIG. 1 as a function of the control voltage BIAS (in volts) applied at bias nodes 112 and 114 for three different operating temperatures (−40 C, 23 C, and 85 C). FIG. 2 is based on an implementation of PIN-diode attenuator 100 of FIG. 1 in which:

- 90-degree hybrid 102 is a 900-MHz GaAs monolithic microwave integrated circuit (MMIC) hybrid;
- Capacitors C1 and C2 are 10 pF capacitors;
- Resistors R1 and R2 are 18 kohm resistors; and
- Diodes D1 and D2 are SMP1304 series PIN diodes available from Skyworks Solutions, Inc., of Woburn, Mass.

As shown in FIG. 2, not only does the operation of attenuator 100 vary as a function of temperature (with attenuation generally decreasing as temperature increases), but attenuator 100 exhibits undesirable non-monotonic behavior at control voltage levels greater than about 11 volts.

SUMMARY OF THE INVENTION

In one embodiment, the present invention is circuitry comprising a PIN-diode attenuator. The attenuator comprises an input node, an output node, first and second bias nodes, at least first and second PIN diodes, and first and second resistive networks. The first resistive network is connected between the first PIN diode and the first bias node, and the second resistive network connected between the second PIN diode and the second bias node. Each resistive network comprises a passive, temperature-sensitive device that provides at least partial compensation for temperature-dependent behavior of the attenuator.

In another embodiment, the present invention is a non-reflective attenuator comprising an input node, an output node, first and second bias nodes, and a 90-degree hybrid. A first DC-blocking capacitor is connected between the input node of the attenuator and an input port of the hybrid, and a second DC-blocking capacitor is connected between an isolated port of the hybrid and the output node of the attenuator. A first PIN diode is connected at a coupled port of the hybrid, and a second PIN diode is connected at a direct port of the hybrid. A first resistive network is connected between the coupled port of the hybrid and the first bias node of the attenuator, and a second resistive network is connected between the direct port of the hybrid and the second bias node of the attenuator. Each of the first and second resistive networks comprises a parallel network, a second resistor, and a low-pass filter. The parallel network comprises a first resistor connected in parallel with an n-type thermistor that provides at least partial compensation for temperature-dependent behavior of the attenuator. The second resistor is connected in series with the parallel network. The low-pass filter is connected to inhibit relatively high-frequency signals in the attenuator from reaching the thermistor, wherein the low-pass filter comprises a capacitor connected in shunt between the first and second resistors.

In yet another embodiment, the present invention is a circuit comprising a PIN diode and a resistive network connected to the PIN diode. The resistive network comprises (i) a parallel network comprising a first resistor connected in parallel with an n-type thermistor and (ii) a second resistor connected in series with the parallel network.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 1 shows a schematic diagram of a conventional PIN-diode attenuator;

FIG. 2 shows a graphical representation of the temperature-dependent relationship of the level of attenuation provided by the PIN-diode attenuator of FIG. 1 as a function of the control voltage;

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Figure 3:
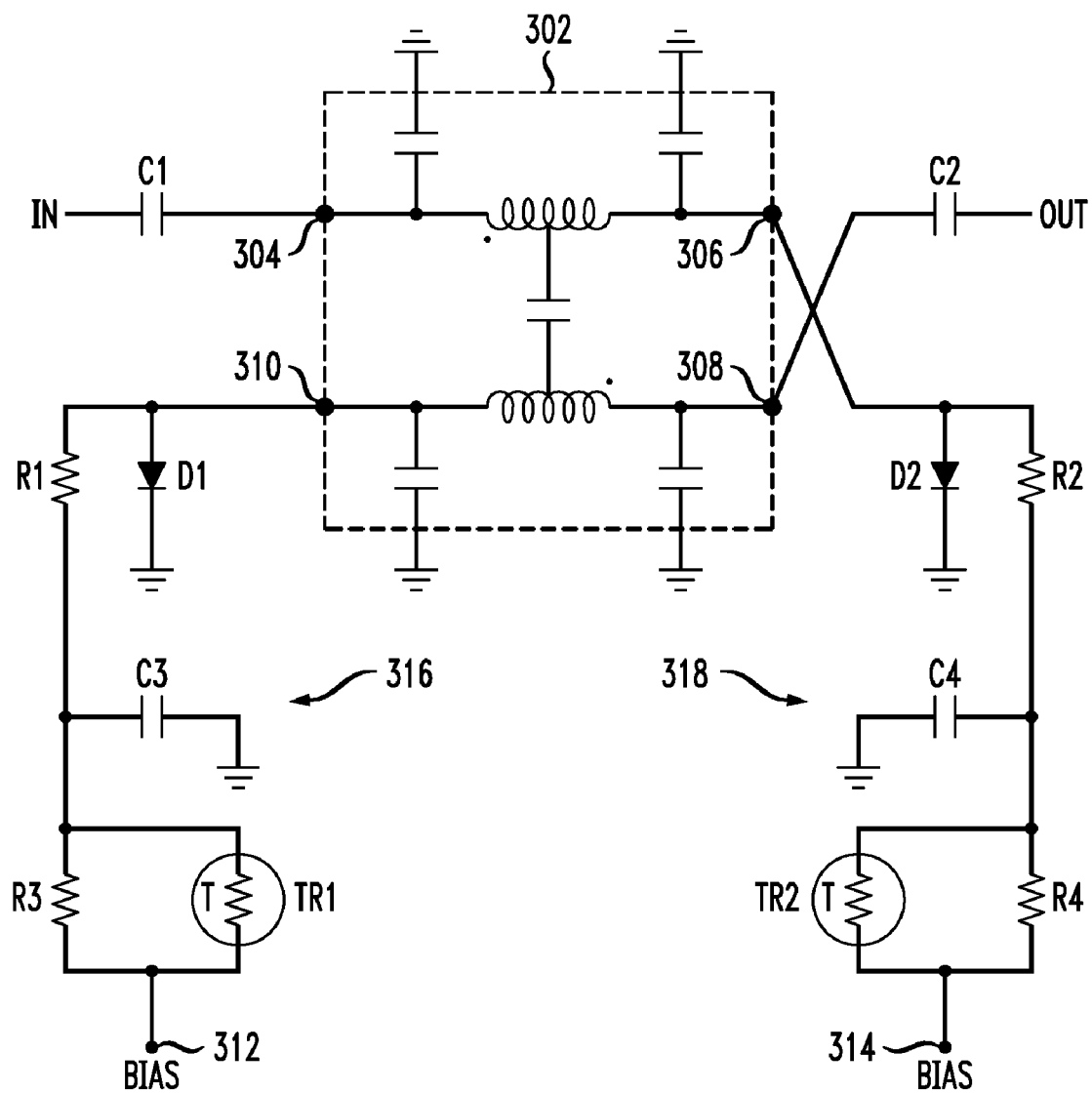
FIG. 3 shows a schematic diagram of a temperature-compensated PIN-diode attenuator according to one embodiment of the present invention.

FIG. 3 shows a schematic diagram of a temperature-compensated PIN-diode attenuator 300, according to one embodiment of the present invention. Like attenuator 100 of FIG. 1, temperature-compensated attenuator 300 includes a 90-degree hybrid 302, DC-blocking capacitors C1 and C2, bias resistors R1 and R2, and PIN diodes D1 and D2, coupling to input port 304, direct port 306, isolated port 308, and coupled port 310 of hybrid 302. In addition, attenuator 300 has capacitors C3 and C4, resistors R3 and R4, and n-type (negative temperature coefficient) thermistors TR1 and TR2, which collectively provide at least partial temperature compensation for attenuator 300. For an n-type thermistor, thermistor resistance decreases as temperature increases.

Resistive network 316 formed by resistors R1 and R3, thermistor TR1, and capacitor C3 and connected between coupled port 310 of hybrid 302 and bias node 312, functions as a temperature-varying current source for PIN diode D1. As temperature increases, the resistance of thermistor TR1 decreases, thereby increasing the current applied to PIN diode D1 for a fixed bias voltage BIAS. In a similar manner, resistive network 318 formed by resistors R2 and R4, thermistor TR2, and capacitor C4 and connected between direct port 306 of hybrid 302 and bias node 314, functions as a temperature-varying current source for PIN diode D2.

Each resistive network (e.g., 316) may be said to be connected in series between a PIN diode (e.g., D1) and a corresponding bias-voltage source (not shown) at a bias node (e.g., 312) for the attenuator. Each resistive network (e.g., 316) may also be said to contain a first resistor (e.g., R1) connected in series with a parallel network formed from a second resistor (e.g., R3) connected in parallel with a thermistor (e.g., TR1), where a capacitor (e.g., C3) is connected in shunt between the first and second resistors.

Together, the two resistive networks operate to compensate (at least partially) for the attenuation decrease exhibited by prior-art attenuator 100 of FIG. 1 as temperature increases.

Capacitors C3 and C4 form low-pass filters that block relatively high-frequency (e.g., RF) signals in the hybrid from reaching thermistors TR1 and TR2, respectively, in order to limit RF distortion in the behavior of the thermistors.

In FIG. 3, hybrid 302, capacitors C1 and C2, and PIN diodes D1 and D2 may be said to form a PIN-diode attenuator having an input node IN and an output node OUT. Resistors R1 and R3, thermistor TR1, and capacitor C3 may be said to form a first temperature-sensitive resistive network 316 connected between coupled port 310 of the PIN-diode attenuator and bias node 312. Similarly, resistors R2 and R4, thermistor TR2, and capacitor C4 may be said to form a second temperature-sensitive resistive network 318 connected between direct port 306 of the PIN-diode attenuator and bias node 314.

Figure 4:
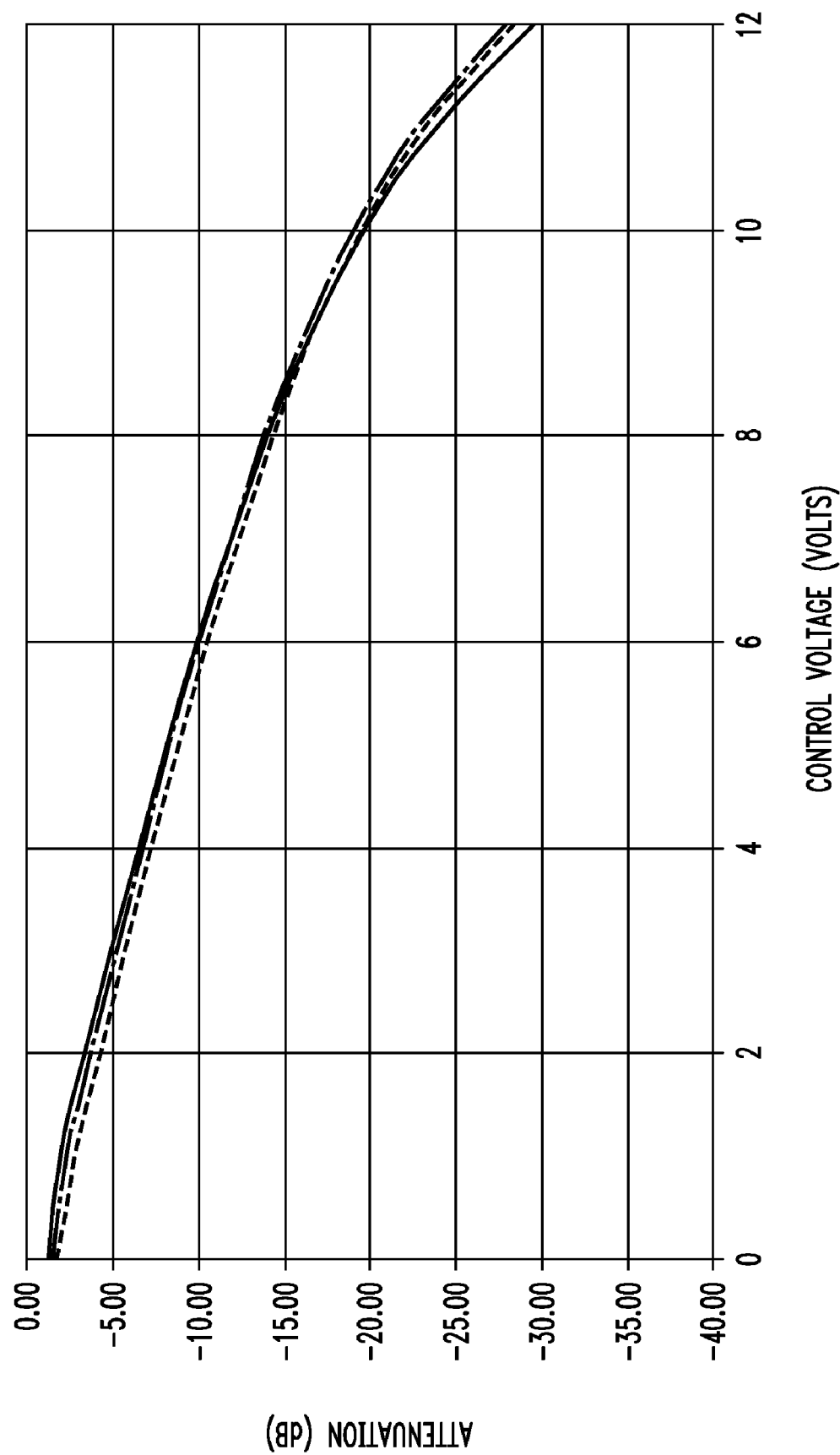
FIG. 4 shows a graphical representation of the temperature-dependent relationship of the level of attenuation provided by the PIN-diode attenuator of FIG. 3 as a function of the control voltage.

FIG. 4 shows a graphical representation of the relationship of the level of attenuation (in dB) provided by PIN-diode attenuator 300 of FIG. 3 as a function of the control voltage BIAS (in volts) applied at bias nodes 312 and 314 for three different operating temperatures (−40 C, 23 C, and 85 C). FIG. 4 is based on an implementation of PIN-diode attenuator 300 of FIG. 3 in which:

90-degree hybrid 302 is a 900-MHz GaAs monolithic microwave integrated circuit (MMIC) hybrid;
Capacitors C1 and C2 are 100 pF capacitors;
Capacitors C3 and C4 are 47 pF capacitors;
Resistors R1 and R2 are 14 kohm resistors;
Resistors R3 and R4 are 8.2 kohm resistors;
Thermistors TR1 and TR2 are 6.8 kohm thermistors having a beta value of 3380, where beta indicates the amount of change in resistance with temperature in accordance with the Steinhart-Hart equation; and Diodes D1 and D2 are SMP1304 series PIN diodes available from Skyworks Solutions, Inc., of Woburn, Mass. Those skilled in the art will understand that, in other implementations of PIN-diode attenuator 300, the different circuit elements can have different values from those listed above. As shown in FIG. 4, the operation of attenuator 300 is substantially independent of the operating temperature.

Although the present invention has been described in the context of PIN-diode attenuator 300 of FIG. 3, the invention is not so limited. For example, although the resistive networks of attenuator 300 are implemented with purely resistive elements (i.e., resistors R1-R4 and thermistors TR1-TR2), in alternative embodiments, a PIN-diode attenuator of the present invention can be implemented with resistive networks having elements, such has inductors, which have both resistive and reactive properties. For example, resistors R1 and R2 can be replaced by inductors for applications with lower bias voltages.

In addition, the configuration of elements within a PIN-diode attenuator of the present invention can be different from that shown in FIG. 3. Furthermore, the low-pass filters formed by capacitors C3 and C4 in attenuator 300 can be achieved using other combinations of circuit elements. Moreover, attenuators of the present invention can be implemented without such low-pass filters, e.g., for relatively low-frequency applications.

Although PIN-diode attenuator 300 has been described as being implemented with n-type thermistors TR1 and TR2, in alternative embodiments, the thermistors can be replaced by other passive devices whose resistance level decreases with increasing temperature, such as Schottky or PN junction devices.

Furthermore, although the present invention has been described in the context of FIG. 3 having two PIN diodes D1 and D2, in general, the present invention can be implemented in the context of PIN-diode attenuators having any suitable number and configuration of diodes. For example, a PIN-diode attenuator of the present invention can replace each of PIN diodes D1 and D2 with a configuration of two or more PIN diodes connected in series. Parallel configurations of PIN diodes and mixed configurations of PIN diodes connected in both series and parallel are also possible.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes or ports may be referred to by the same name and are interchangeable for purposes here.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

What is claimed is:

1. A circuit comprising:
   a PIN diode; and
   a resistive network connected to the PIN diode, the resistive network comprising:
   a parallel network comprising a first resistor connected in parallel with an n-type thermistor;
   a second resistor connected in series with the parallel network; and
   a low-pass filter connected to inhibit relatively high-frequency signals at the PIN diode from reaching the thermistor.

2. The circuit of claim 1, wherein the low-pass filter comprises a capacitor connected in shunt between the first and second resistors.

3. The circuit of claim 1, wherein the PIN diode and the resistive network are part of a PIN-diode attenuator.

4. The circuit of claim 1, wherein:
   the resistive network further comprises a low-pass filter connected to inhibit relatively high-frequency signals at the PIN diode from reaching the thermistor, wherein the low-pass filter comprises a capacitor connected in shunt between the first and second resistors; and
   the circuit is a non-reflective, PIN-diode attenuator further comprising:
   a 90-degree hybrid having a first port connected to the PIN diode and to the resistive network;
   another PIN diode and another resistive network connected to a second port of the hybrid; and first and second DC-blocking capacitors connected to third and fourth ports of the hybrid.

5. The circuit of claim 1, further comprising a hybrid having a first port connected to the PIN diode and to the resistive network.

6. The circuit of claim 5, further comprising another PIN diode and another resistive network connected to a second port of the hybrid.

7. The circuit of claim 6, further comprising first and second DC-blocking capacitors connected to third and fourth ports of the hybrid.

8. The circuit of claim 7, wherein:
   the hybrid is a 90-degree hybrid; and
   the circuit is a non-reflective, PIN-diode attenuator.

9. Circuitry comprising a PIN-diode attenuator, the attenuator comprising:
   an input node, an output node, and first and second bias nodes;
   at least first and second PIN diodes;
   a first resistive network connected between the first PIN diode and the first bias node; and
   a second resistive network connected between the second PIN diode and the second bias node, wherein each resistive network comprises a passive, temperature-sensitive device that provides at least partial compensation for temperature-dependent behavior of the attenuator wherein each passive, temperature-sensitive device is an n-type thermistor and at least one of the first and second resistive networks comprises:
   a parallel network comprising a first resistor connected in parallel with the thermistor; and
   a second resistor connected in series with the parallel network.

10. The circuitry of claim 9, wherein at least one of the first and second resistors comprises an inductor.

11. The circuitry of claim 9, wherein:
    the attenuator is a non-reflective attenuator comprising a 90-degree hybrid connected to the input node, the output node, the first and second PIN diodes, and the first and second resistive networks;
    the first PIN diode and the first resistive network are connected to a coupled port of the hybrid;
    the second PIN diode and the second resistive network are connected to a direct port of the hybrid;
    the attenuator further comprises:
    a first DC-blocking capacitor connected between the input node of the attenuator and an input port of the hybrid; and
    a second DC-blocking capacitor connected between an isolated port of the hybrid and the output node of the attenuator,
    each passive, temperature-sensitive device is an n-type thermistor;
    each of the first and second resistive networks comprises:
    a parallel network comprising a first resistor connected in parallel with the thermistor;
    a second resistor connected in series with the parallel network; and
    a low-pass filter connected to inhibit relatively high-frequency signals in the attenuator from reaching the thermistor, wherein the low-pass filter comprises a capacitor connected in shunt between the first and second resistors.

12. The circuitry of claim 9, wherein the attenuator is a non-reflective attenuator comprising a 90-degree hybrid connected to the input node, the output node, the first and second PIN diodes, and the first and second resistive networks.

13. The circuitry of claim 12, wherein:
    the first PIN diode and the first resistive network are connected to a coupled port of the hybrid; the second PIN diode and the second resistive network are connected to a direct port of the hybrid; and
    the attenuator further comprises:
    a first DC-blocking capacitor connected between the input node of the attenuator and an input port of the hybrid; and
    a second DC-blocking capacitor connected between an isolated port of the hybrid and the output node of the attenuator.

14. The circuitry of claim 9, wherein the at least one resistive network further comprises a low-pass filter connected to inhibit relatively high-frequency signals in the attenuator from reaching the thermistor.

15. The circuitry of claim 14, wherein the low-pass filter comprises a capacitor connected in shunt between the first and second resistors.

16. A non-reflective attenuator comprising:
    an input node, an output node, and first and second bias nodes;
    a 90-degree hybrid;
    a first DC-blocking capacitor connected between the input node of the attenuator and an input port of the hybrid;
    a second DC-blocking capacitor connected between an isolated port of the hybrid and the output node of the attenuator;
    a first PIN diode connected at a coupled port of the hybrid;
    a second PIN diode connected at a direct port of the hybrid;
    a first resistive network connected between the coupled port of the hybrid and the first bias node of the attenuator;

a second resistive network connected between the direct port of the hybrid and the second bias node of the attenuator, wherein each of the first and second resistive networks comprises:
  a parallel network comprising a first resistor connected in parallel with an n-type thermistor that provides at least partial compensation for temperature-dependent behavior of the attenuator;
  a second resistor connected in series with the parallel network; and
  a low-pass filter connected to inhibit relatively high-frequency signals in the attenuator from reaching the thermistor, wherein the low-pass filter comprises a capacitor connected in shunt between the first and second resistors.

17. The attenuator of claim 16, wherein at least one of the resistors comprises an inductor.

* * * * *